(12) United States Patent
Schulz et al.

(10) Patent No.: US 9,762,146 B2
(45) Date of Patent: Sep. 12, 2017

(54) METHODS AND SYSTEMS FOR INTERCONNECTING PARALLEL IGBT MODULES

(71) Applicant: Faraday&Future Inc., Gardena, CA (US)

(72) Inventors: Steven E. Schulz, Torrance, CA (US); David Tang, Rancho Cucamonga, CA (US); Silva Hiti, Redondo Beach, CA (US)

(73) Assignee: FARADAY&FUTURE INC., Gardena, CA (US)

( * ) Notice: Subject to any disclaimer, the term of this patent is extended or adjusted under 35 U.S.C. 154(b) by 0 days.

(21) Appl. No.: 14/929,173

(22) Filed: Oct. 30, 2015

(65) Prior Publication Data

US 2017/0126145 A1    May 4, 2017

(51) Int. Cl.
*G05F 1/569*  (2006.01)
*H02M 7/5387*  (2007.01)
*H02M 7/537*  (2006.01)

(52) U.S. Cl.
CPC .................. *H02M 7/537* (2013.01)

(58) Field of Classification Search
CPC .......... G05F 1/445; G05F 1/565; G05F 1/567; G05F 1/569; G05F 1/573; G05F 3/242; H02M 2001/0009; H02M 2001/327; H02M 7/493; H02M 7/5387; H02M 7/49; H02M 7/53806; H02M 7/5381; H02M 1/32
USPC ........ 323/274–277; 363/56.01–56.12, 71, 72
See application file for complete search history.

(56) References Cited

U.S. PATENT DOCUMENTS

| | | | |
|---|---|---|---|
| 6,618,278 B2 | 9/2003 | Suzuki et al. | |
| 6,621,701 B2 | 9/2003 | Tamba et al. | |
| 7,710,721 B2 | 5/2010 | Matsuo et al. | |
| 7,830,689 B2 | 11/2010 | Nakamura et al. | |
| 7,855,887 B2 | 12/2010 | Kakuda et al. | |
| 7,965,510 B2 | 6/2011 | Suzuki et al. | |
| 8,072,758 B2 | 12/2011 | Groppo et al. | |
| 8,159,849 B2 | 4/2012 | Nakajima et al. | |
| 8,432,714 B2* | 4/2013 | Keronen | H02M 7/493 363/71 |
| 8,587,977 B2 | 11/2013 | Nishikimi et al. | |
| 8,614,906 B2 | 12/2013 | Nakajima et al. | |
| 8,699,254 B2 | 4/2014 | Nishikimi et al. | |

(Continued)

*Primary Examiner* — Adolf Berhane
*Assistant Examiner* — Gary Nash
(74) *Attorney, Agent, or Firm* — Finnegan, Henderson, Farabow, Garrett & Dunner, LLP (57) ABSTRACT

A system for interconnecting parallel insulated gate bipolar transistor (IGBT) modules is provided. A pair of switches selected from a plurality of the IGBT modules are assigned to a driver integrated circuit (IC). In the pair of switches, a master IGBT switch is selected, the other switch being a slave IGBT switch. A command signal from the driver IC is electrically coupled to both the master and slave IGBT switches. The master and slave IGBT switches both have protective circuits; however, the driver IC is electrically coupled to the protective circuits of the selected master IGBT switch only. The protective circuits include temperature and current sense circuits. The plurality of the IGBT modules may be formed by two hexpack power modules. The modules are configured such that only a single driver IC is needed for each pair of parallel IGBT switches, with equal current sharing of the paralleled modules.

15 Claims, 4 Drawing Sheets

(56) References Cited

U.S. PATENT DOCUMENTS

| | | | |
|---|---|---|---|
| 8,717,788 B2* | 5/2014 | Chen | H02M 1/15 |
| | | | 363/56.01 |
| 8,848,370 B2 | 9/2014 | Shin et al. | |
| 8,953,335 B2 | 2/2015 | Abe et al. | |
| 9,042,101 B2 | 5/2015 | Tokuyama et al. | |
| 9,042,147 B2 | 5/2015 | Ishii et al. | |
| 9,048,721 B2 | 6/2015 | Abe et al. | |
| 9,241,428 B1 | 1/2016 | Doo et al. | |
| 2002/0034087 A1 | 3/2002 | Suzuki et al. | |
| 2003/0067748 A1 | 4/2003 | Tamba et al. | |
| 2006/0052914 A1 | 3/2006 | Kubokawa et al. | |
| 2006/0274561 A1 | 12/2006 | Ahmed et al. | |
| 2008/0251909 A1 | 10/2008 | Tokuyama et al. | |
| 2011/0205724 A1 | 8/2011 | Nakajima et al. | |
| 2011/0279074 A1* | 11/2011 | Yeh | G01K 7/42 |
| | | | 318/432 |
| 2012/0217795 A1* | 8/2012 | Hasegawa | B60L 3/003 |
| | | | 307/9.1 |
| 2012/0235622 A1* | 9/2012 | Welchko | B60L 3/0038 |
| | | | 318/722 |
| 2013/0039009 A1 | 2/2013 | Shin et al. | |
| 2013/0314014 A1* | 11/2013 | Tremel | H02M 7/53871 |
| | | | 318/400.22 |
| 2014/0104902 A1* | 4/2014 | Casares | H02H 3/44 |
| | | | 363/56.01 |
| 2015/0029666 A1 | 1/2015 | Kosuga et al. | |

* cited by examiner

METHODS AND SYSTEMS FOR INTERCONNECTING PARALLEL IGBT MODULES

FIELD

The present disclosure relates generally to inverters and, more specifically, to inverters utilizing insulated gate bipolar transistors (IGBT) modules.

BACKGROUND

Electric and hybrid vehicle propulsion systems typically employ an alternating current (AC) motor drive inverter to transform direct current (DC) voltage of the energy storage battery to variable speed AC waveforms in order to drive the electric motor. Most commonly, the inverter uses a current controlled voltage source configuration. Power semiconductor switches, such as, for example, insulated gate bipolar transistors (or IGBTs) can be used to pulse width modulate (PWM) the voltage applied to the motor. The motor acts as a large filter and smooths the waveforms such that the current becomes nearly sinusoidal.

In high performance vehicles, it may be desired to have a large motor torque. Torque is roughly proportional to the current, so a high performance vehicle typically requires a large AC current to drive the motor, making protection circuits even more essential.

SUMMARY OF THE PRESENT DISCLOSURE

According to various embodiments, the present disclosure may be directed to methods for interconnecting parallel insulated gate bipolar transistor (IGBT) modules. An example method includes assigning a pair of switches selected from a plurality of the IGBT modules to a driver integrated circuit (IC). The pair of switches can include a first IGBT switch and a second IGBT switch. The method further includes electrically coupling the first IGBT switch and the second IGBT switch to the driver IC, the electrically coupling including electrically coupling the driver IC to a protective circuit of a selected one of the first and second IGBT switches.

In some embodiments, the first IGBT switch includes at least one protective circuit. The protective circuit may include a temperature sense and a current sense circuit. In some embodiments, the plurality of the IGBT modules includes a pre-determined number of discrete IGBT switches. In certain embodiments, the plurality of the IGBT modules includes a pre-determined number of half-bridge modules. Each of the half-bridge modules can include an upper IGBT switch and a lower IGBT switch.

In some embodiments of the disclosure, the plurality of the IGBT modules includes a first hexpack power module and a second hexpack power module. Each of the first hexpack power module and the second hexpack power module can include six IGBT switches with three upper IGBT switches and three lower IGBT switches.

BRIEF DESCRIPTION OF THE DRAWINGS

Certain embodiments of the present disclosure are illustrated by the accompanying figures. It will be understood that the figures are not necessarily to scale and that all details not necessary for understanding the technology or that render other details difficult to perceive may be omitted. It will be understood that the technology is not necessarily limited to the particular embodiments illustrated herein.

DESCRIPTION OF EXEMPLARY EMBODIMENTS

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that like or analogous elements and/or components, referred to herein, may be identified throughout the drawings with like reference characters. It will be further understood that several of the figures are merely schematic representations of the present disclosure. As such, some of the components may have been distorted from their actual scale for pictorial clarity.

In general, various embodiments of the present disclosure are directed to a method for interconnecting IGBT modules to provide better protection and relatively equal current sharing. The IGBT modules can be used in inverters configured to transform direct current (DC) voltage of the energy storage battery to variable speed AC waveforms in order to drive the electric motor. An example inverter assembly is described in U.S. patent application Ser. No. 14/841,520, filed Aug. 31, 2015, titled "Inverter Assembly", the disclosure of which is incorporated herein by reference for all purposes.

Various embodiments of the present disclosure may facilitate reduction in the number of driver integrated circuits for driving inverters while providing better protection of the parallel IGBT devices. Some embodiments can comprise a driver integrated circuit (IC) and a pair of switches selected from a plurality of the IGBT modules. The pair of switches can include a first IGBT switch and a second IGBT switch. The first IGBT switch, the second IGBT switch, and the driver IC can be electrically coupled to allow the first IGBT switch and the second IGBT switch to receive at least a command signal from the driver IC. The first IGBT switch can be electrically coupled to the driver IC to allow the driver IC to receive a signal from at least one protective circuit of the first IGBT switch. The protective circuit can include a temperature sensor and a current sense circuit. Although the second IGBT switch in the pair of switches also has protective circuits, in various embodiments, the protective circuits of the second IGBT switch are not coupled to the driver IC. Thus, only the protective circuits of the first IGBT switch may be coupled to the driver IC; with both IGBT switches of the pair being coupled to the gate command of the driver IC. Various embodiment can allow a single driver IC to drive each pair of paralleled IGBT switches, rather than requiring a separate driver IC for each switch.

Figure 1:
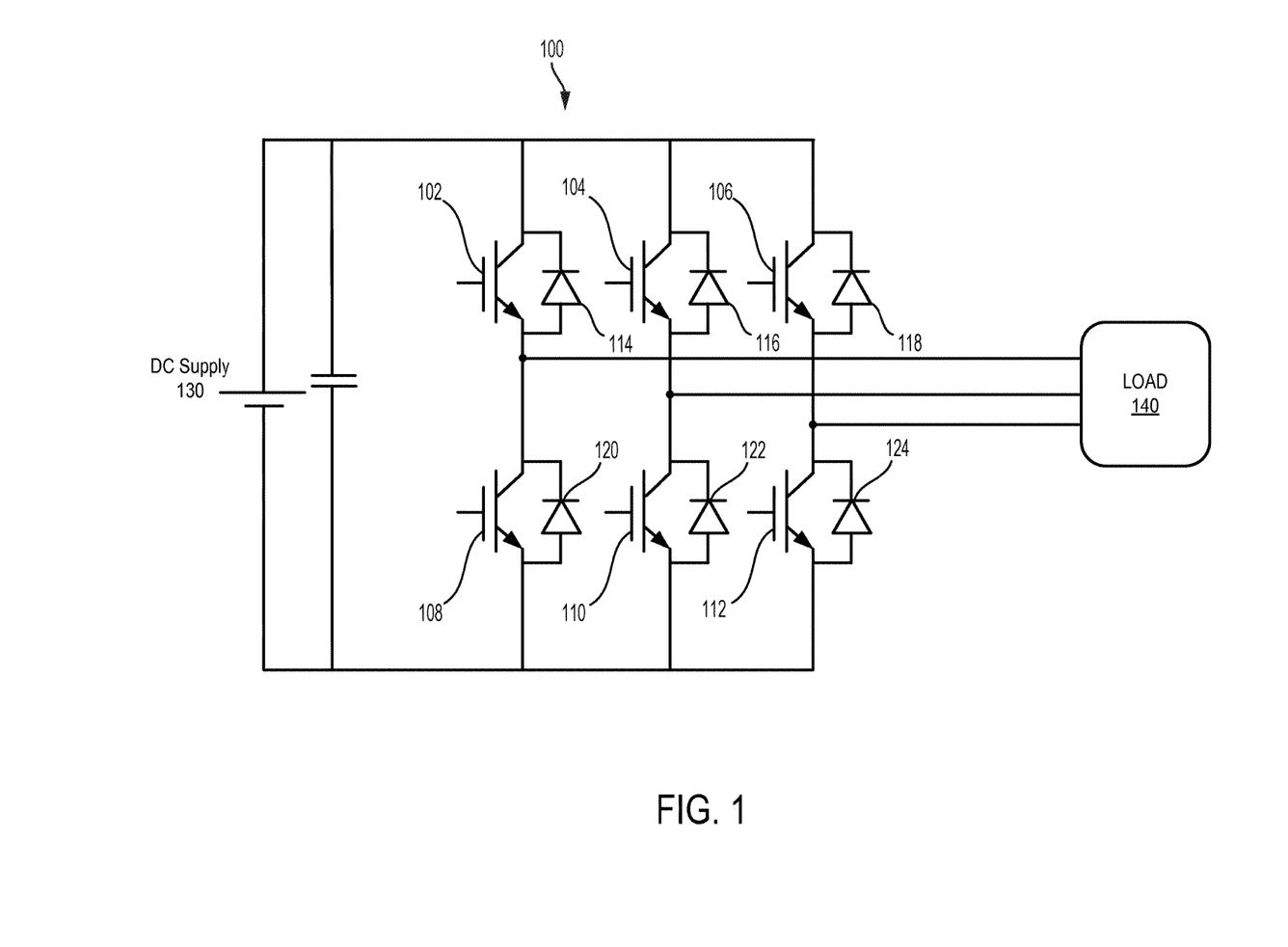
FIG. 1 is a block diagram showing an exemplary three phase voltage source inverter.

FIG. 1 illustrates an exemplary three phase voltage inverter 100. The inverter 100 can include 6 IGBT switches 102, 104, 106, 108, 110, and 112 and 6 diodes 114, 116, 118, 120, 122, and 124. Each IGBT switch 102-112 can be coupled to one of diodes 114-124. The IGBT switches can be configured to receive direct current from the DC supply 130 and produce three phase AC. Three phase AC can be fed to a load 140, for example, a three phase motor.

In some embodiments, to generate a high current, two or more IGBT devices can be connected in parallel. In one example embodiment, 12 individual discrete IGBT switches (with an integral diode) are used so that each inverter switch is composed of two devices connected in parallel. Alternatively in other embodiments, half-bridge modules can be used. Each half-bridge module can include an upper switch and a lower switch and diodes in a single package. Six half-bridge modules can form a single high current inverter, with two modules connected in parallel for each phase.

Hexpack power modules may be used to form a high current inverter. While the present disclosure describes an interconnection of IGBT devices in two hexpack power modules, similar approaches can be applied to either half-bridge modules or individual discrete IGBT modules. In various embodiments, with proper packaging and electrical design, the parallel IGBT device can be configured to share the load current relatively equally.

Figure 2:
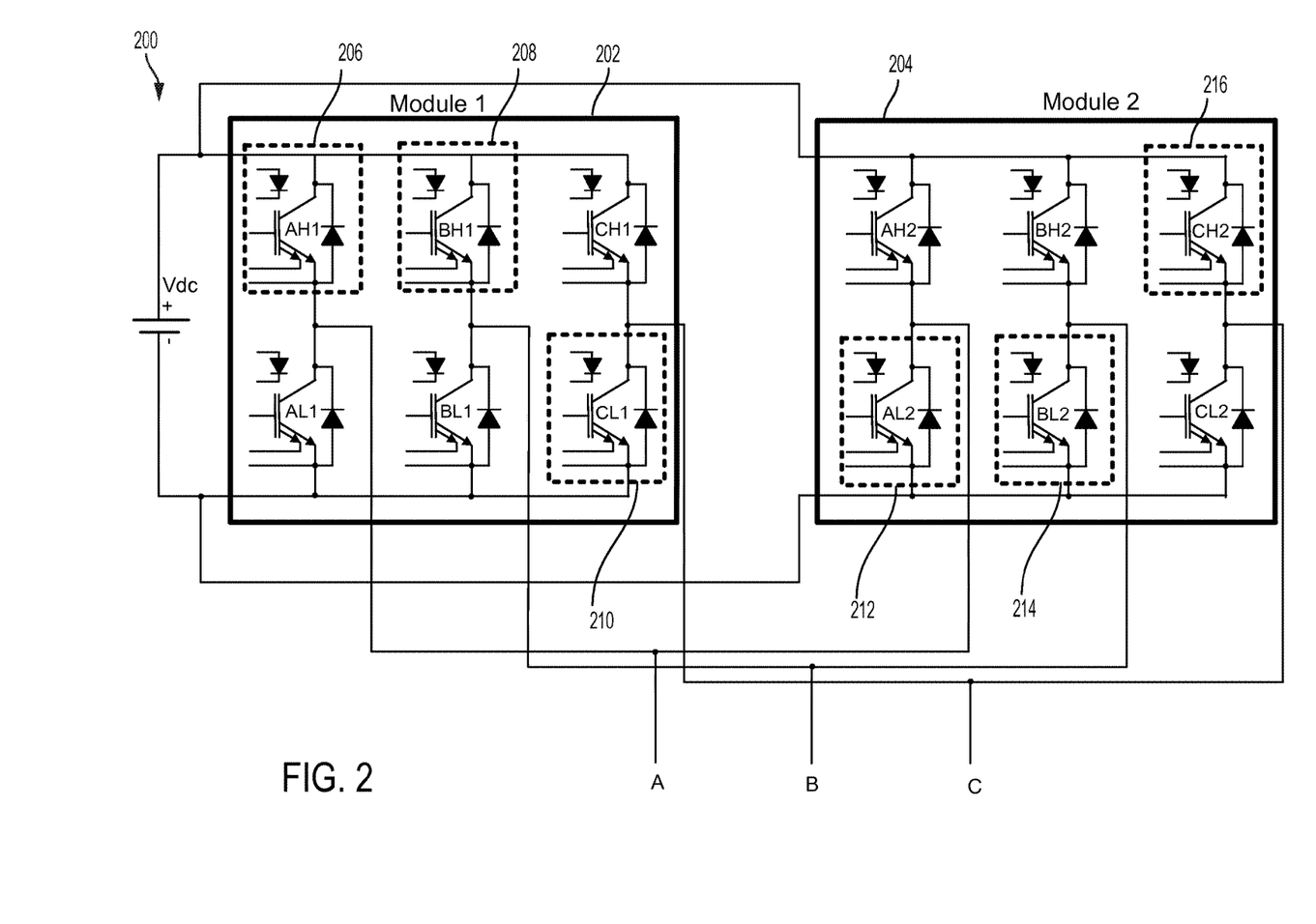
FIG. 2 is a block diagram illustrating a high current inverter utilizing two parallel hexpack power modules, according to various embodiments.

FIG. 2 shows an exemplary high current inverter 200 utilizing two parallel hexpack power modules 202 and 204, according to various embodiments. As shown, each hexpack power module 202 and 204 includes 6 IGBT switches and 6 antiparallel diodes. Each IGBT switch may include an emitter current mirror and on die temperature sensing.

In conventional designs, each IGBT switch is assigned a driver integrated circuit (IC). The driver IC includes built in features to provide over-current and overtemperature protection. In various embodiments, in the case of parallel IGBT devices, a single driver IC is assigned to each pair of parallel IGBT switches. On one hand, assigning a single driver IC to each pair of parallel IGBT switches may reduce costs. On the other hand, assigning the single driver IC to each pair of parallel IGBT switches can provide for (relatively) equal current sharing of the parallel IGBT devices.

In some example embodiments, a common buffer stage can be used to take the driver IC gate command signal and drive the two parallel IGBT switches. However, the driver IC is only designed, in various embodiments, to interface with a single IGBT switch's protection circuits (for example, current sense and temperature sense). In order to drive 12 IGBT switches, for example, the IGBT switches of the two hexpack power modules 202 and 204 shown in FIG. 2, a total of six driver ICs are required to provide the optimal protection of the parallel IGBT devices.

In various embodiments, for each parallel pair of IGBTs, one IGBT device can be assigned as the "master" and another IGBT device can be assigned as the "slave".

Figure 3:
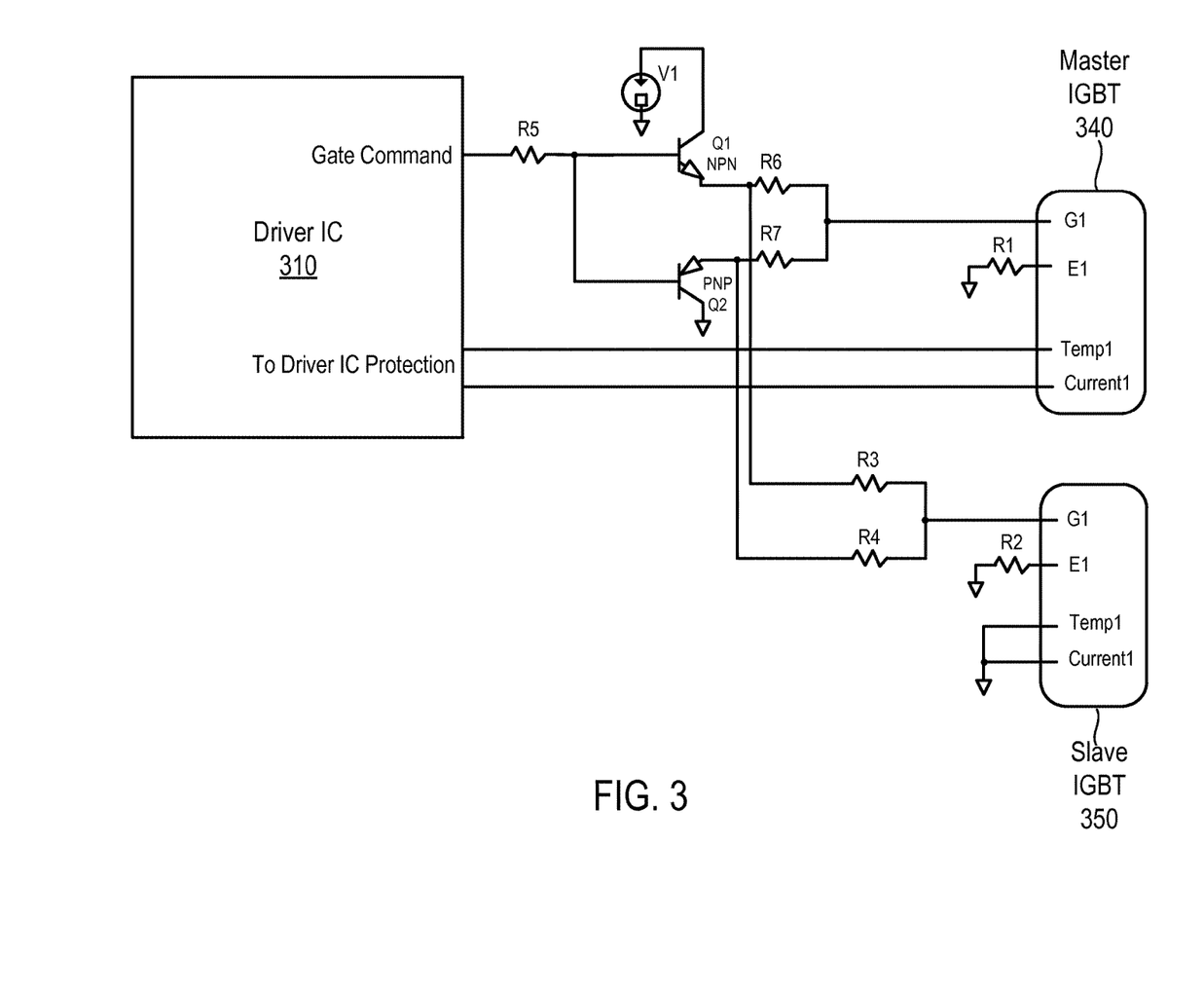
FIG. 3 is a block diagram showing a connection of a master IGBT switch, a slave IGBT switch, and a driver IC, according to various embodiments.

FIG. 3 shows a simplified schematic illustrating the gate and protection circuit connections for the master IGBT and the slave IGBT. The on die temperature sense and a current sense of the master IGBT 340 are connected to the driver IC 310 in this example. The on die temperature sensing and the current sense of the slave IGBT 350 are not used in various embodiments.

Referring back now to FIG. 2, for the inverter topology featuring two parallel hexpack power modules 202 and 204, only three of the IGBT devices in each hexpack power module are selected as masters, according to various embodiments. Performing such a selection can equally spread the protection circuits amongst the two parallel hexpack power modules. As shown in the example in FIG. 2, phase A leg of hexpack power module 202 is connected with phase A leg of hexpack power module 204 in parallel, phase B leg of hexpack power module 202 is connected in parallel with phase B leg of hexpack power module 204, and phase C leg of hexpack power module 202 is connected in parallel with phase C leg of hexpack power module 204.

In some embodiments, each phase leg in each module (202, 204) has two IGBT switches—a selected IGBT switch as "master" and another IGBT switch as "slave". Also, for each leg, if the upper IGBT switch is selected as "master" in one of the hexpack power modules, then the lower IGBT switch in the other hexpack power module may also be selected as "master". Similarly, for each leg, if the lower IGBT switch is selected as "master" in one of the hexpack power modules, then the upper IGBT switch in the other hexpack power module can also be selected as "master". For example, referring to the example in FIG. 2, the upper IGBT switch 206 (AH1), upper IGBT switch 208 (BH1), and lower IGBT switch 210 (CL1) are selected as master IGBT switches from the first hexpack power module 202 (also identified as "Module 1" in FIG. 2). In this example, the remaining three IGBT switches in the first hexpack power module 202 can be slave IGBT switches (i.e., not selected as master).

In the second hexpack power module 204 (also identified as "Module 2" in the example in FIG. 2), the lower IGBT switch 212 (AL2), lower IGBT switch 214 (BL2), and upper IGBT switch 216 (CH2) are selected as master IGBT switch devices. Other combinations and selections are possible, consistent with the present disclosure. In various embodiments, for each power module, at least one of the upper IGBT switches in the power module is a master and at least one of the lower IGBT switches in that same power module is also a master; and for each phase leg, there will be a master in the complementary position in the other module (e.g., upper IGBT switch (AH1) in phase A of Module 1 in FIG. 2 being selected as a master, and lower IGBT switch (AL2) in phase A (in the complementary position in Module 2) is also selected as a master).

The protective circuits of IGBT switches 206, 208, and 210 (such as current sense and/or temperature sense) can be connected to a respective gate driver IC. Similarly, IGBT switches 212 (AL2), 214 (BL2) and 216 (CH2) are selected as masters from the second hexpack power module 204 in this example. Using this approach, according to various embodiments, at least one IGBT device in each phase leg of each module may be used for protection purposes. This approach, according to various embodiments, can insure that every phase leg is protected against shoot-through events. A shoot-through event can happen when both upper and lower IGBTs are accidentally turned on at the same time. Similarly, in various embodiments, if an IGBT device fails short, there will always be a master in the complementary position of the same phase (leg) which will detect shoot-through condition when that IGBT switch (ie the complementary master switch) is commanded on. Additionally, if one of the module's AC output terminals become disconnected, the remaining module can carry the entire current of the load. This can cause the remaining connected semiconductor devices can overheat. Since each phase has a master IGBT switch in each module, in various embodiments, the over temperature protection is able to detect this condition and protect the devices. Various embodiments for connecting the IGBT devices as described in FIGS. 2 and 3 can provide needed protection while keeping a minimum number of driver ICs.

Figure 4:
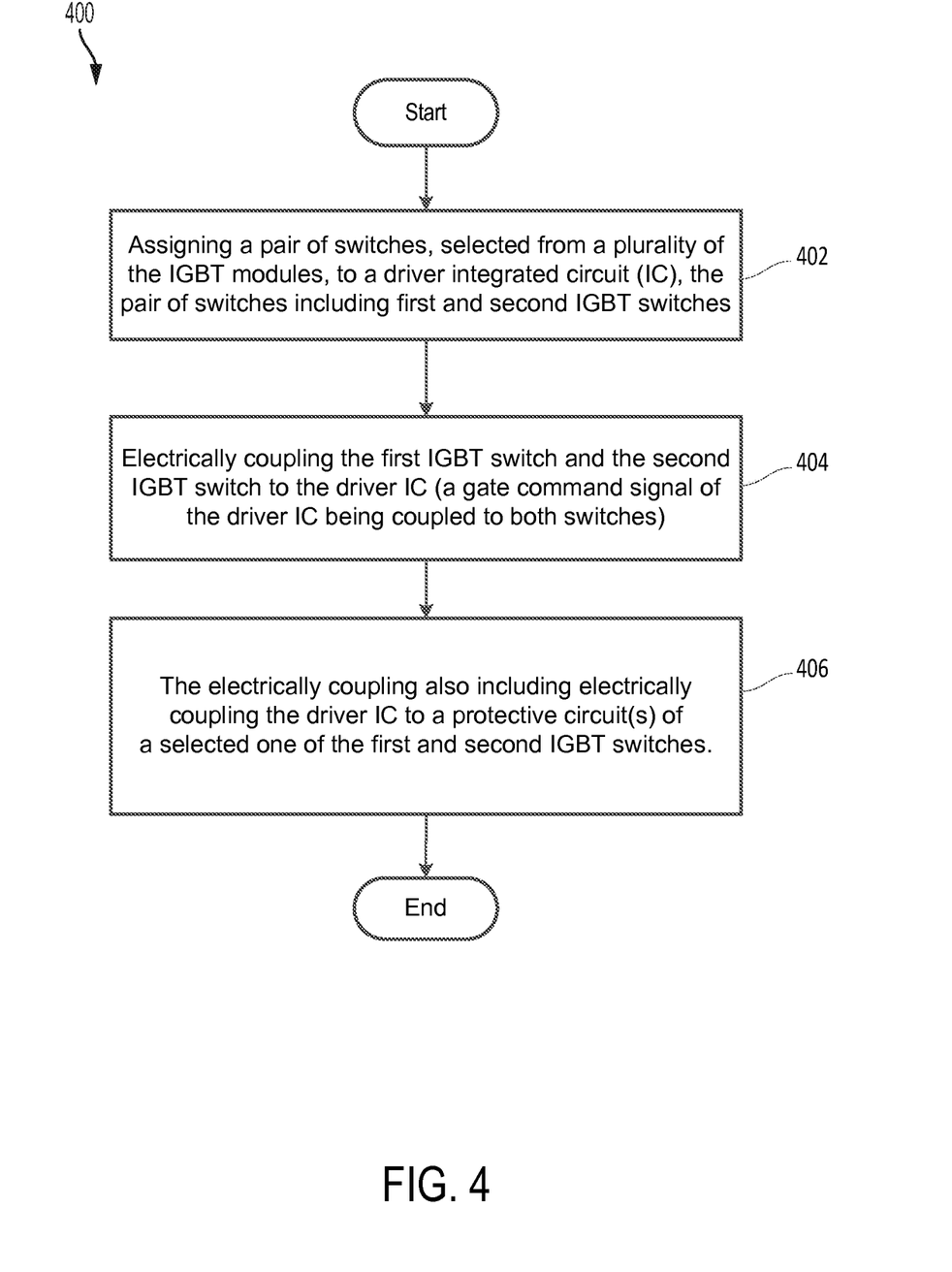
FIG. 4 is a flow chart showing steps of a method for interconnecting parallel IGBT modules, according to various embodiments.

FIG. 4 is a flow chart showing steps of a method 400 for interconnecting IGBT modules, according to an example embodiment. The method 400 can commence, in block 402, with assigning a pair of switches selected from a plurality of the IGBT modules to a driver integrated circuit (IC). The pair of switches can include a first IGBT switch (the master) and a second IGBT switch (the slave). In block 404, the first IGBT switch and the second IGBT switch can be electrically coupled to the driver IC. In various embodiments, the electrically coupling can allow the first IGBT switch and the second IGBT switch to receive at least a (gate) command signal from the driver IC.

In block 406, the method 400 can proceed with electrically coupling the driver IC to receive a signal from the protective circuit of a selected one of the first and second IGBT switches.

In some embodiments, the protective circuit includes a temperature sense (sensor) for detecting if a preset temperature has been exceeded.

The method may further comprise electrically coupling the driver IC to another protective circuit of the selected one of the first and second IGBT switches. The other protective circuit can include a current sense circuit for detecting if a preset current has been exceeded. In various embodiments, the driver IC gate command signal is coupled to both the first IGBT switch and the second IGBT switch. In the example in FIG. 3, the driver IC is coupled to the overtemperature ("Temp1") and overcurrent ("Current1") protection circuits of just a selected one ("Master IGBT 340") of the two IGBT switches; with both of the two IGBT switches ("Master IGBT 340" and "Slave IGBT 350") being coupled to the gate command input of the driver IC 310.

The pair of switches may be connected (for example, as shown in FIG. 2) with a further pair of switches selected from the plurality of the IGBT modules, the pair of switches and the further pair of switches being configured to generate the same phase of alternating current. In some embodiments, the plurality of the IGBT modules includes a pre-determined number of half-bridge modules, each of the half-bridge modules including an upper IGBT switch and a lower IGBT switch.

The plurality of the IGBT modules may include a first hexpack power module and a second hexpack power module, each of the first hexpack power module and the second hexpack power module including six IGBT switches, the six IGBT switches including three upper IGBT switches and three lower IGBT switches.

The first IGBT switch may be selected from three of the six switches of the first hexpack power module or three of the six switches of the second hexpack power module.

In some embodiments, the plurality of the IGBT modules includes a pre-determined number of discrete IGBT switches.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments.

It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. A method for interconnecting parallel insulated gate bipolar transistor (IGBT) modules, the method comprising:
    assigning a pair of switches selected from a plurality of IGBT modules to a driver integrated circuit (IC), the pair of switches including a first IGBT switch and a second IGBT switch; and
    electrically coupling the first IGBT switch and the second IGBT switch to the driver IC, the electrically coupling including:
        electrically coupling the driver IC to a protective circuit of a selected one of the first and second IGBT switches,
    wherein the plurality of the IGBT modules includes a first hexpack power module and a second hexpack power module, each of the first hexpack power module and the second hexpack power module including six IGBT switches, the six IGBT switches including three upper IGBT switches and three lower IGBT switches, wherein the IGBT switches of each power module are configured to produce three phases of alternating current;
    wherein, for each of the first and second hexpack power modules, the IGBT switches are arranged such that there are an upper IGBT switch and a lower IGBT switch for each of a first phase, second phase, and third phase of the three phases;
    wherein, in the first hexpack power module, the upper IGBT switch of the first phase, the upper IGBT switch of the second phase, and the lower IGBT switch of the third phase are selected as master IGBT switches;
    wherein, in the second hexpack power module, the lower IGBT switch of the first phase, the lower IGBT switch of the second phase, and the upper IGBT switch of the third phase are selected as master IGBT switches, the remaining IGBT switches in the first and second hexpack power modules being slave IGBT switches;
    wherein, for each of the first and second hexpack power modules, protective circuits of the selected master IGBT switches are electrically coupled to a respective driver IC; and
    wherein, for each of the phases, the master and slave IGBT switches are electrically coupled to a gate command input of the respective driver IC.

2. The method of claim 1, wherein the protective circuit includes a temperature sensor for detecting if a preset temperature has been exceeded.

3. The method of claim 2, further comprising electrically coupling the driver IC to another protective circuit of the selected one of the first and second IGBT switches.

4. The method of claim 3, wherein the other protective circuit includes a current sense circuit for detecting if a preset current has been exceeded.

5. The method of claim 1, wherein a driver IC gate command signal is coupled to both the first IGBT switch and the second IGBT switch.

6. The method of claim 1, wherein the pair of switches is connected with a further pair of switches selected from the plurality of the IGBT modules, the pair of switches and the further pair of switches being configured to generate the same phase of alternating current.

7. The method of claim 1, wherein the plurality of the IGBT modules includes a predetermined number of half-bridge modules, each of the half-bridge modules including an upper IGBT switch and a lower IGBT switch.

8. A method for interconnecting parallel insulated gate bipolar transistor (IGBT) modules, the method comprising:
   assigning a pair of switches selected from a plurality of IGBT modules to a driver integrated circuit (IC), the pair of switches including a first IGBT switch and a second IGBT switch; and
   electrically coupling the first IGBT switch and the second IGBT switch to the driver IC, the electrically coupling including:
      electrically coupling the driver IC to a protective circuit of a selected one of the first and second IGBT switches,
   wherein the plurality of the IGBT modules includes a first hexpack power module and a second hexpack power module, each of the first hexpack power module and the second hexpack power module including six IGBT switches, the six IGBT switches including three upper IGBT switches and three lower IGBT switches, wherein the IGBT switches of each power module are configured to produce three phases of alternating current;
   wherein, in each of the first and second hexpack power modules, the IGBT switches are arranged such that there are an upper IGBT switch and a lower IGBT switch for each of a first phase, second phase, and third phase of the three phases;
   wherein three of the upper IGBT switches are selected as master upper IGBT switches and the remaining upper IGBT switches are selected as slave upper IGBT switches;
   wherein three of the lower IGBT switches are selected as master lower IGBT switches and the remaining lower IGBT switches are selected as slave lower IGBT switches; and
   wherein at least one of the upper IGBT switches in each of the first and second hexpack power modules is selected as a master IGBT switch for the corresponding phase.

9. A method for interconnecting parallel insulated gate bipolar transistor (IGBT) modules, the method comprising:
   assigning a pair of switches selected from a plurality of IGBT modules to a driver integrated circuit (IC), the pair of switches including a first IGBT switch and a second IGBT switch; and
   electrically coupling the first IGBT switch and the second IGBT switch to the driver IC, the electrically coupling including:
      electrically coupling the driver IC to a protective circuit of a selected one of the first and second IGBT switches,
   wherein the plurality of the IGBT modules includes a first hexpack power module and a second hexpack power module, each of the first hexpack power module and the second hexpack power module including six IGBT switches, the six IGBT switches including three upper IGBT switches and three lower IGBT switches, wherein the IGBT switches of each power module are configured to produce three phases of alternating current;
   wherein, in each of the first and second hexpack power modules, the IGBT switches are arranged such that there are an upper IGBT switch and a lower IGBT switch for each of a first phase, second phase, and third phase of the three phases;
   wherein three of the upper IGBT switches are selected as master upper IGBT switches and the remaining upper IGBT switches are selected as slave upper IGBT switches;
   wherein three of the lower IGBT switches are selected as master lower IGBT switches and the remaining lower IGBT switches are selected as slave lower IGBT switches; and
   wherein at least one of the lower IGBT switches in each of the first and second hexpack power modules is selected as a master lower IGBT switch for the corresponding phase.

10. A method for interconnecting parallel insulated gate bipolar transistor (IGBT) modules, the method comprising:
   assigning a pair of switches selected from a plurality of IGBT modules to a driver integrated circuit (IC), the pair of switches including a first IGBT switch and a second IGBT switch; and
   electrically coupling the first IGBT switch and the second IGBT switch to the driver IC, the electrically coupling including:
      electrically coupling the driver IC to a protective circuit of a selected one of the first and second IGBT switches,
   wherein the plurality of the IGBT modules includes a first hexpack power module and a second hexpack power module, each of the first hexpack power module and the second hexpack power module including six IGBT switches, the six IGBT switches including three upper IGBT switches and three lower IGBT switches, wherein the IGBT switches of each power module are configured to produce three phases of alternating current;
   wherein, in each of the first and second hexpack power modules, the IGBT switches are arranged such that there are an upper IGBT switch and a lower IGBT switch for each of a first phase, second phase, and third phase of the three phases;
   wherein three of the upper IGBT switches are selected as master upper IGBT switches and the remaining upper IGBT switches are selected as slave upper IGBT switches;
   wherein three of the lower IGBT switches are selected as master lower IGBT switches and the remaining lower IGBT switches are selected as slave lower IGBT switches; and
   wherein at most two of the upper IGBT switches in each of the first and second hexpack power modules are selected as master upper IGBT switches for the corresponding phases.

11. A method for interconnecting parallel insulated gate bipolar transistor (IGBT) modules, the method comprising:

assigning a pair of switches selected from a plurality of IGBT modules to a driver integrated circuit (IC), the pair of switches including a first IGBT switch and a second IGBT switch; and electrically coupling the first IGBT switch and the second IGBT switch to the driver IC, the electrically coupling including:

electrically coupling the driver IC to a protective circuit of a selected one of the first and second IGBT switches, wherein the plurality of the IGBT modules includes a first hexpack power module and a second hexpack power module, each of the first hexpack power module and the second hexpack power module including six IGBT switches, the six IGBT switches including three upper IGBT switches and three lower IGBT switches, wherein the IGBT switches of each power module are configured to produce three phases of alternating current;

wherein, in each of the first and second hexpack power modules, the IGBT switches are arranged such that there are an upper IGBT switch and a lower IGBT switch for each of a first phase, second phase, and third phase of the three phases;

wherein three of the upper IGBT switches are selected as master upper IGBT switches and the remaining upper IGBT switches are selected as slave upper IGBT switches;

wherein three of the lower IGBT switches are selected as master lower IGBT switches and the remaining lower IGBT switches are selected as slave lower IGBT switches; and wherein at most two of the lower IGBT switches in each of the first and second hexpack power modules are selected as master lower IGBT switches for the corresponding phases.

12. A system for interconnecting parallel insulated gate bipolar transistor (IGBT) modules, the system comprising:

a driver integrated circuit (IC); and a pair of switches selected from a plurality of IGBT modules, the pair of switches including a first IGBT switch and a second IGBT switch, the first IGBT switch and the second IGBT switch being electrically coupled to the driver IC, the electrically coupling including electrically coupling the driver IC to protective circuits of a selected one of the first and second IGBT switches, wherein the plurality of the IGBT modules includes a first hexpack power module and a second hexpack power module, each of the first hexpack power module and the second hexpack power module including six IGBT switches, the six IGBT switches including three upper IGBT switches and three lower IGBT switches, wherein the IGBT switches of each power module are configured to produce three phases of alternating current;

wherein, for each of the first and second hexpack power modules, the IGBT switches are arranged such that there are an upper IGBT switch and a lower IGBT switch for each of a first phase, second phase, and third phase of the three phases;

wherein, in the first hexpack power module, the upper IGBT switch of the first phase, the upper IGBT switch of the second phase, and the lower IGBT switch of the third phase are selected as master IGBT switches;

wherein, in the second hexpack power module, the lower IGBT switch of the first phase, the lower IGBT switch of the second phase, and the upper IGBT switch of the third phase are selected as master IGBT switches, the remaining IGBT switches in the first and second hexpack power modules being slave IGBT switches;

wherein, for each of the first and second hexpack power modules, protective circuits of the selected master IGBT switches are electrically coupled to a respective driver IC; and wherein, for each of the phases, the master and slave IGBT switches are electrically coupled to a gate command input of the respective driver IC.

13. The system of claim 12, wherein the first IGBT switch is a master and the second IGBT switch is a slave, and the protective circuits of the first IGBT switch coupled to the driver IC include a temperature sense for detecting if a preset temperature has been exceeded and a current sense circuit for detecting if a preset current has been exceeded.

14. The system of claim 12, wherein the pair of switches is connected in parallel with a further pair of switches selected from the plurality of the IGBT modules, the pair of switches and the further pair of switches being configured to generate the same phase of alternating current.

15. The system of claim 12, wherein the plurality of the IGBT modules includes a pre-determined number of half-bridge modules, each of the half-bridge modules including an upper IGBT switch and a lower IGBT switch.

* * * * *